(12) United States Patent
Murdoch et al.

(10) Patent No.: US 7,978,073 B2
(45) Date of Patent: Jul. 12, 2011

(54) TRANSMITTER AND A METHOD FOR TRANSMITTING DATA

(75) Inventors: Graham Alexander Munro Murdoch, Wollstonecraft (AU); Stuart Colin Littlechild, Haberfield (AU)

(73) Assignee: Magellan Technology Pty Limited, Annandale, New South Wales (AU)

( * ) Notice: Subject to any disclaimer, the term of this patent is extended or adjusted under 35 U.S.C. 154(b) by 1875 days.

(21) Appl. No.: 10/927,957

(22) Filed: Aug. 26, 2004

(65) Prior Publication Data
US 2006/0022797 A1 Feb. 2, 2006

Related U.S. Application Data

(63) Continuation of application No. 09/582,341, filed as application No. PCT/AU98/01077 on Dec. 24, 1998, now abandoned.

(51) Int. Cl.
*G08B 13/14* (2006.01)
(52) U.S. Cl. .................. 340/572.1; 340/505; 340/539.1; 340/825.69; 340/825.71; 340/825.73; 340/825.77
(58) Field of Classification Search .................. 340/505, 340/539.1, 825.69, 825.71, 825.73, 825.77
See application file for complete search history.

(56) References Cited

U.S. PATENT DOCUMENTS

| | | | |
|---|---|---|---|
| 4,011,562 A | 3/1977 | Bruce | |
| 4,074,198 A | 2/1978 | Furuya et al. | |
| 4,106,059 A * | 8/1978 | Henderson et al. | ........... 348/731 |
| 4,249,214 A | 2/1981 | Boyd | |
| 4,307,464 A | 12/1981 | Hughes | |
| 4,837,853 A * | 6/1989 | Heck | .............. 455/208 |
| 4,899,158 A | 2/1990 | Saeki et al. | |
| 4,972,440 A | 11/1990 | Ernst et al. | |
| 5,325,403 A * | 6/1994 | Siwiak et al. | ................. 375/347 |
| 5,374,930 A | 12/1994 | Schuermann | |
| 5,481,262 A | 1/1996 | Urbas et al. | |
| 5,783,926 A | 7/1998 | Moon et al. | |
| 5,784,686 A | 7/1998 | Wu et al. | |
| 6,005,638 A | 12/1999 | Blair et al. | |
| 6,005,894 A | 12/1999 | Kumar | |
| 6,034,603 A | 3/2000 | Steeves | |
| 6,061,475 A | 5/2000 | Blair | |
| 6,353,406 B1 | 3/2002 | Lanzl et al. | |
| 6,404,325 B1 | 6/2002 | Heinrich et al. | |

(Continued)

FOREIGN PATENT DOCUMENTS
EP 0 403 085 1/1997
(Continued)

OTHER PUBLICATIONS

Jay Were et al., "The Practical Engineer: Designing a Positioning System for Finding Things and People Indoors", IEEE Spectrum, vol. 35, No. 9, pp. 71-78, Sep. 1998.

(Continued)

*Primary Examiner* — Daryl Pope
(74) *Attorney, Agent, or Firm* — Winstead PC

(57) ABSTRACT

An excitation reference source ($F_C$) is split through a 90 degree splitter. One output from the splitter is fed to the LO port of a mixer. Data is fed to the mixer's IF port and causes PRK modulation of the LO port's signal. The output of the mixer at the RF port is a PRK modulated quadrature signal. This is attenuated and added back onto the reference by a zero degree combiner ready for transmission to the transponder.

20 Claims, 5 Drawing Sheets

U.S. PATENT DOCUMENTS

| | | |
|---|---|---|
| 6,456,668 B1 | 9/2002 | MacLellan et al. |
| 6,538,564 B1 | 3/2003 | Cole et al. |
| 6,556,942 B1 | 4/2003 | Smith |
| 6,687,293 B1 * | 2/2004 | Loyer et al. .................. 375/239 |
| 6,967,573 B1 * | 11/2005 | Murdoch et al. .............. 340/505 |

FOREIGN PATENT DOCUMENTS

| | | |
|---|---|---|
| EP | 0 851 639 | 7/1998 |
| GB | 2 314 999 | 1/1998 |
| JP | 62084632 A | 4/1987 |
| JP | 02217043 A | 8/1990 |
| JP | 07131376 A | 5/1995 |
| JP | 09-027772 A | 1/1997 |
| JP | 09-305810 | 11/1997 |

OTHER PUBLICATIONS

The AIM Global Network, "Radio Frequency Identification-RFID A Basic Primer", The Association for Automatic Identification and Data Capture Technologies, Sep. 28, 1999, pp. 1-12.

The Association of the Automatic Identification and Data Capture Industry, "Draft Paper on the Characteristics of RFID-Systems", AIM Frequency Forums, Jul. 2000, pp. 1-26, AIM, Inc., Pittsburgh, PA.

* cited by examiner

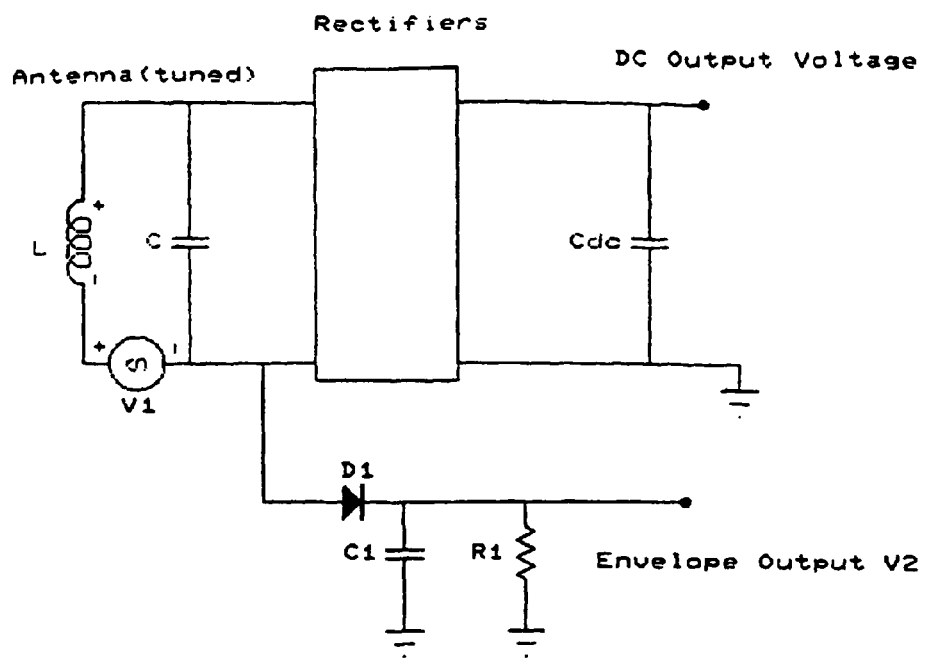
Figure 1 : Prior Art Transponder
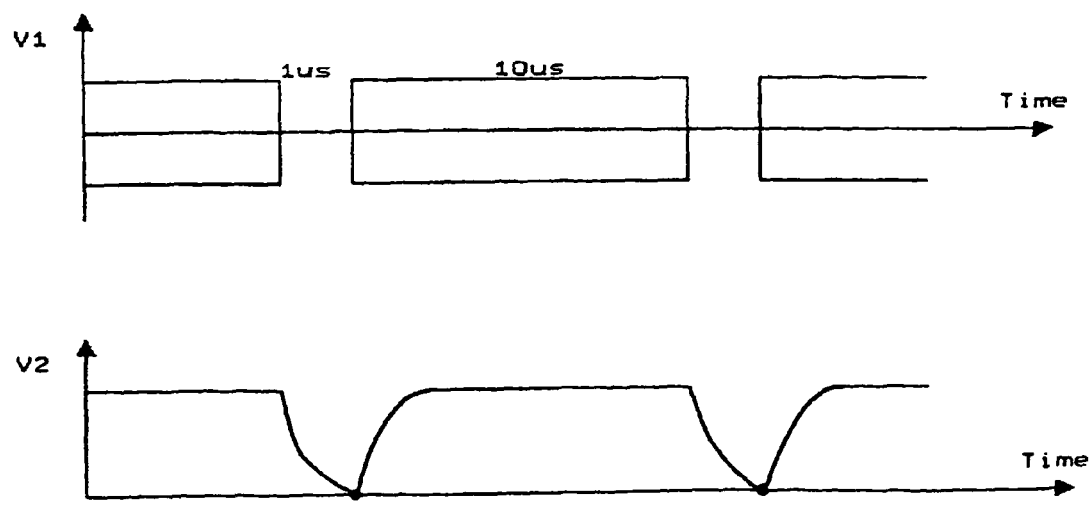
Figure 2 : Excitation V1 and Detected Envelope V2

Figure 3(a) : Data Spectrum
Figure 3(b) : Pulse Position Spectrum
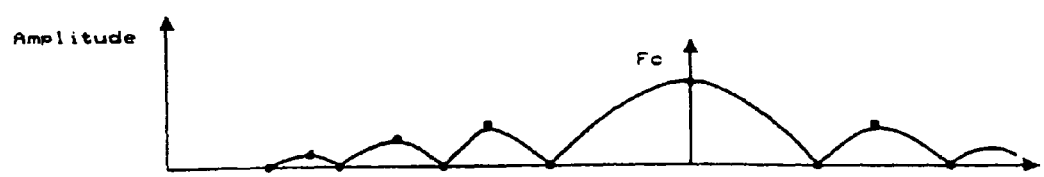
Figure 3(c) : Excitation Spectrum Modulated with PPM
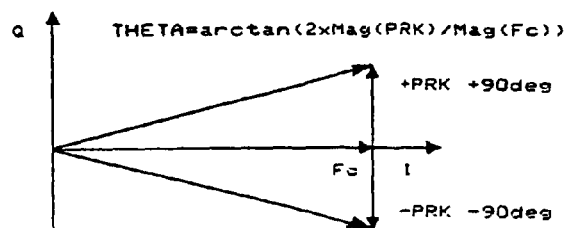
Figure 4(a) : Phasor diagram showing Excitation and Modulation
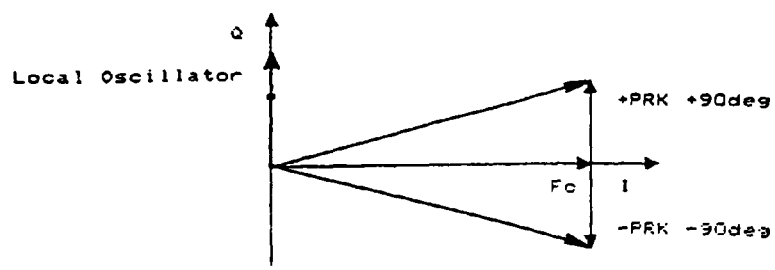
Figure 4(b) : Phasor diagram Showing Local Oscillator at 90deg to Fc

Figure 5(a) : Data Spectrum
Figure 5(b) : Data Modulated Quadrature Excitation
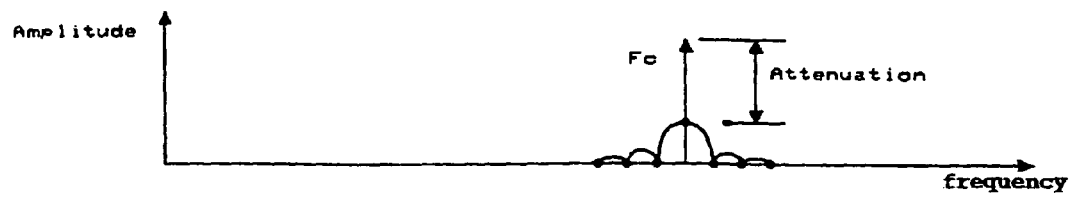
Figure 5(c) : Excitation Spectrum plus Attenuated Quadrature Modulation
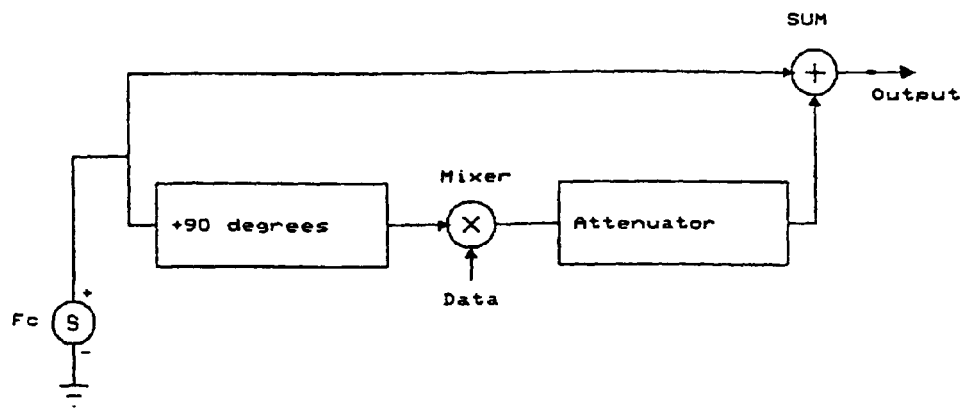
Figure 6(a) : Method of Modulating Excitation Signal

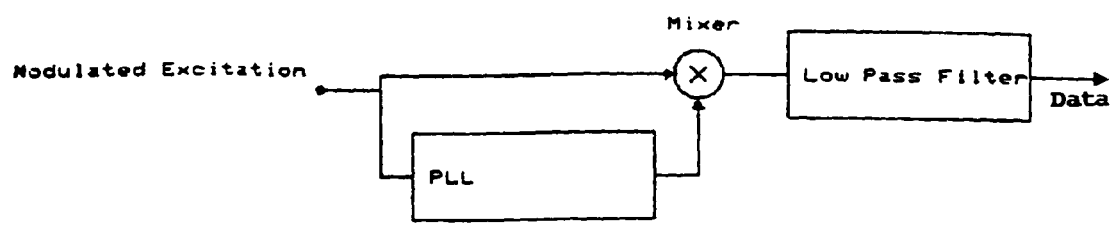
Figure 6(b) : Method of Demodulation
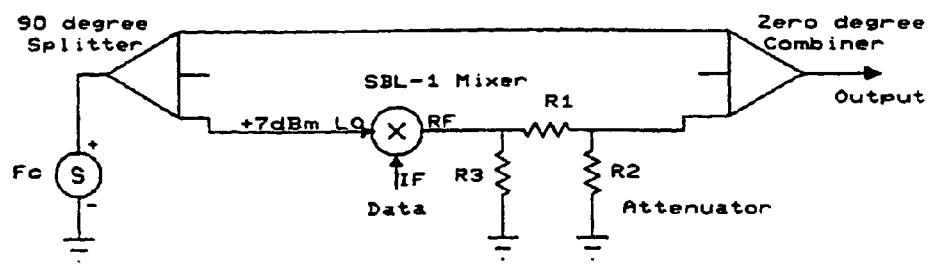
Figure 7 : Example Circuit for Modulating

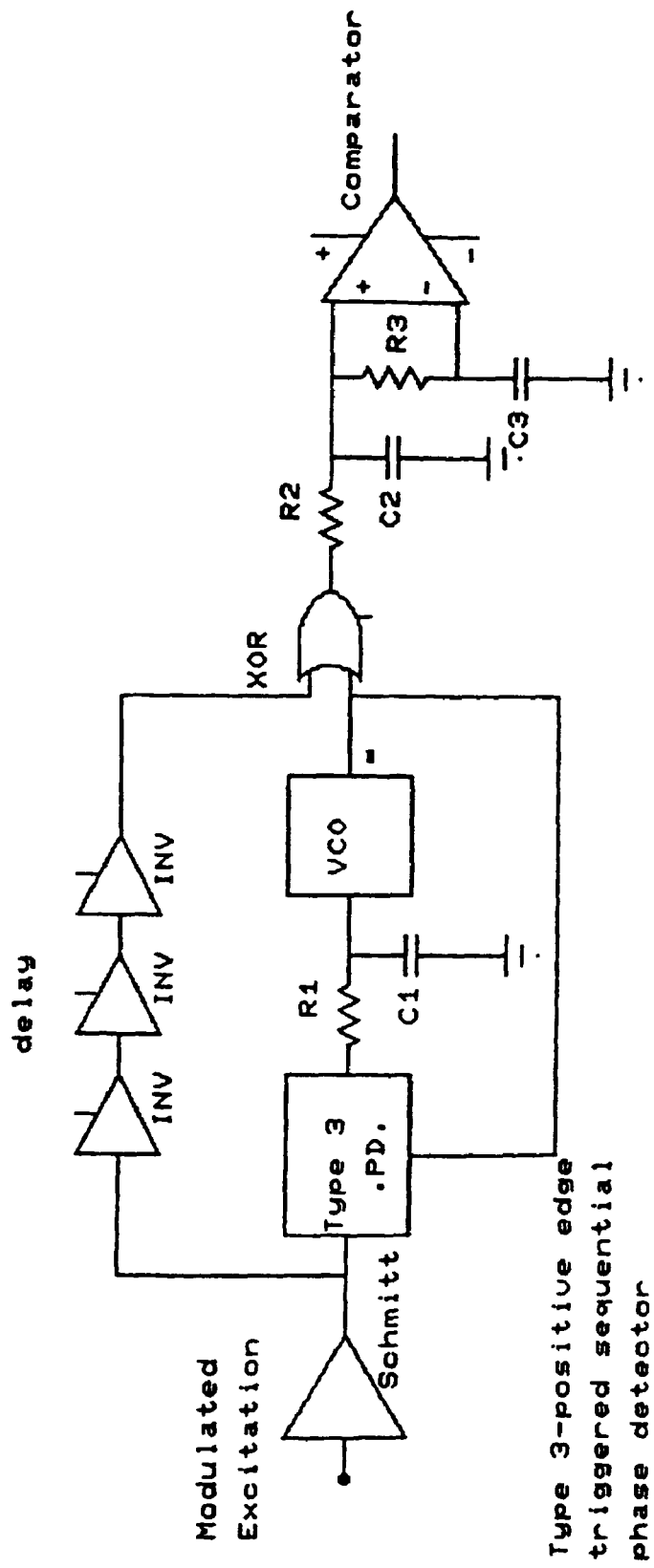
Figure 8 : Example Circuit for Demodulating

US 7,978,073 B2

TRANSMITTER AND A METHOD FOR TRANSMITTING DATA

CROSS REFERENCE TO RELATED APPLICATIONS

This patent application is a continuation of U.S. patent application Ser. No. 09/582,341, filed on Aug. 22, 2000. U.S. patent application Ser. No. 09/582,341 is a National Stage Application of International Patent Application PCT/AU98/01077, filed on Dec. 24, 1998. International Patent Application PCT/AU98/01077 is incorporated herein by reference.

FIELD

The invention relates to a transmitter and a method for transmitting data.

The invention has been developed primarily for the field of radio frequency identification (RFID), and more particularly to a method for transmitting data to a transponder with a single antenna, and will be described hereinafter with reference to that application. This invention has particular merit when applied to passive transponders where high speed data transmission is desirable.

BACKGROUND

Hitherto, high speed data has been transmitted to RFID transponders by modulation of the excitation field. Generally pulse position modulation with 100% depth amplitude modulation of the excitation field is used. The excitation field is turned off for short intervals which are detected by the transponder's processing circuitry. To achieve high data rates while maintaining the transmission of power the intervals must be short and the duty cycle low. Typically a duty cycle of 10% is used and the intervals are 1 μs long and the average time between intervals is 10 μs. Short intervals such as these have a wide bandwidth. Accordingly, both the interrogator and the transponder require low Q factor, wide bandwidth antennae to transmit and receive the data. Low Q factor antennae are not energy efficient and, as such, the interrogator antenna will consume more power than a high Q factor antenna. Moreover, for passive transponders a stronger excitation field is required to compensate for the less efficient antenna.

Additionally, regulations governing the magnitude of electromagnetic emissions place upper limits on the strength of excitation fields that can be used and the allowable bandwidth of an excitation field. The wide bandwidth of the prior art pulse, modulation data results in limitations being placed on the maximum excitation field strength.

DISCLOSURE

It is an object of the invention, at least in the preferred embodiment, to overcome or substantially ameliorate at least one of the disadvantages of the prior art.

According to one aspect of the invention there is provided a method for transmitting data from a first antenna, said method including the steps of:
 providing a carrier signal;
 imposing a low level phase modulation on the carrier signal in accordance with a data signal to create a modulated signal
 providing the modulated signal to said first antenna for transmission.

According to a second aspect of the invention there is provided a transmitter including:
 a first antenna;
 oscillator means for providing a carrier signal; and
 mixing means for imposing a low level phase modulation on the carrier signal in accordance with a data signal to create a modulated signal, the mixing means also providing the modulated signal to the first antenna for transmission.

Preferably, the modulated signal is received by a second antenna which in response thereto, produces a first signal which is provided to receiver means, the receiver means deriving a second signal indicative of the data signal. Even more preferably, the first signal is used to power the receiver means.

In a preferred form, the modulated signal includes the sum of the carrier signal and an attenuated quadrature carrier signal which is modulated with the data signal. This form of modulation is described herein as phase jitter modulation (PJM).

In a preferred form the antenna is a tunable coil. Preferably also, both the first and second antennas have a high Q factor.

According to another aspect of the invention there is provided an identification system including a transmitter as described above.

Preferably, the system is for identifying luggage.

BRIEF DESCRIPTION OF THE DRAWINGS

The prior art and a preferred embodiment of the invention will now be described, by way of example only, with reference to the accompanying drawings, in which:

FIG. 1 is a schematic illustration of a prior art transponder circuit;

FIG. 2 illustrates representative waveforms associated with the prior art circuit of FIG. 1;

FIGS. 3(a) to 3(c) are frequency spectra associated with the waveforms of the prior art circuit of FIG. 1;

FIGS. 4(a) and 4(b) are phasor diagrams for waveforms produced in accordance with the invention;

FIG. 5(a) to 5(c) are frequency spectra associated with the invention;

FIGS. 6(a) and 6(b) respectively illustrate methods of encoding and decoding data in accordance with the invention;

FIG. 7 is a schematic illustration of a preferred circuit for encoding the data signal for transmission; and FIG. 8 is a schematic illustration of a preferred circuit for decoding the data signal in the transponder.

DETAILED DESCRIPTION OF A PREFERRED EMBODIMENT

Passive RFID transponders that incorporate a single antenna are interrogated by an interrogator using an excitation field. This field is received by the transponder's antenna and the voltage induced on the antenna is rectified and used to power the transponder. Often it is necessary for the transponder to receive data transmitted from its interrogator. For single antenna transponders the received messages must be received by the same antenna that is used to receive the excitation signal used to power the transponder. In prior art systems the excitation signal is amplitude modulated to convey messages from the interrogator to the transponder.

FIG. 1 shows a prior art transponder where the antenna L is tuned by a capacitor C and data is transmitted to the transponder by amplitude modulation. The voltage V1 induced in the transponder's antenna coil is magnified by the antenna's tuning, rectified by the rectifiers and stored on the DC storage capacitor Cdc for use by the transponder's electronic circuits. The antenna voltage is peak level detected by the diode envelope detector D1, C1 and R1 to give the envelope voltage V2.

FIGS. 2(a) and 2(b) illustrate waveforms associated with the prior art circuit of FIG. 1. More particularly, FIG. 2(a) shows the excitation voltage V1 with amplitude intervals to giving pulse position modulation. To deliver the maximum power to the transponder, a low duty cycle is used, typically 10:1. FIG. 2(b) shows the envelope of the voltage V2 induced in the antenna. The antenna's transient response results in a finite rise and fall time for V2. The transient time of the antenna must be sufficiently short to allow narrow pulses to pass without significant distortion. The antenna's transient response time constant Ts and bandwidth BW are related by Ts=1/(BW·π). Accordingly, to pass short pulses the bandwidth of the antenna must be broad. For example, to pass 1 µs pulses a bandwidth of at least 1 MHz is required.

FIGS. 3(a) to 3(c) are frequency spectra associated with the prior art circuit of FIG. 1. FIG. 3(a) shows a typical data spectrum. For data at 100 kbps the first zero of the frequency spectrum occurs at 100 kHz. FIG. 3(b) shows the data spectrum when encoded as pulse position modulation PPM where narrow low duty cycle pulses are used. The spectrum for this type of encoding is much broader than the original data spectrum. For 1 µs pulses with a 10:1 duty cycle the first amplitude zero of the frequency spectrum occurs at 1 MHz. FIG. 3(c) shows the spectrum of the excitation signal when modulated with the PPM signal whose spectrum is shown at FIG. 3(b). The modulated spectrum is double sided and accordingly, for 1 µs pulses with a 10:1 duty cycle the width of the main spectral lobe is 2 MHz. Clearly the bandwidth of the PPM modulated excitation signal is much broader than the original data spectrum.

To pass the inherently broad band PPM excitation signal both the interrogator and transponder antenna must have a wide bandwidth. Consequently, the interrogator and transponder antennae must have a low Q and will operate with a low efficiency. In the interrogator the generation of 100% amplitude modulated PPM requires that excitation signal be completely quenched for each pulse. This requires a wide band low efficiency antenna. Narrow band antennae would operate with high efficiency but are unable to respond to the narrow amplitude pulses of PPM. Similarly, the transponder antenna bandwidth must be broad band enough to pass the modulated excitation signal. Broad band antennae are inherently low Q and are poor collectors of energy from an excitation field.

In this preferred embodiment of the invention data is imposed as a low level signal having a modulated quadrature component. Most preferably this modulation is phase modulation although in other embodiments use is made of amplitude modulation. In the present embodiment the low level signal appears as a tiny phase jitter in the excitation field. There is no change in the amplitude of the excitation field and hence the transmission of power to the transponder is unaffected. This form of modulation will be termed phase jitter modulation or, for convenience, PJM.

There are many methods of producing small modulated phase shifts. For example, by passing the signal through a phase shifter such as an RC or tuned circuit, or through a variable length delay line.

In this embodiment, to produce the signal at the interrogator, a small portion of the excitation signal is phase shifted 90 degrees to give a quadrature signal. This is then PRK modulated with the data signal and added back onto the original excitation signal before being transmitted to the transponder. The resultant signal can be amplitude limited to remove any residual amplitude component. At the transponder these tiny phase shifts in the excitation induce corresponding antenna voltage phase shifts that are unaltered by any circuit impedances or power regulation circuitry connected to the transponder's antenna.

FIG. 4(a) is a phasor diagram of the excitation signal Fc and the modulated quadrature signal PRK. The amplitude of the respective signals are given by their phasor lengths. The phase deviation THETA caused by the modulated quadrature signal is, for low level signals, extremely small and is given by:

THETA=arctan(2×Mag(PRK)/Mag(Fc))

For a 40 dB attenuated PRK signal THETA=1.2 degrees and for a 60 dB attenuated PRK signal THETA=0.12 degrees. Both of these are extremely small phase deviations of the excitation signal.

Phase quadrature modulation is recovered using a local oscillator (LO) signal, with a fixed phase with respect to the excitation signal, to down convert the modulated data to baseband in a mixer or multiplier. In the transponder the LO signal must be derived from the modulated excitation signal. The preferred method of extracting a LO signal from the modulated excitation signal uses a Phase Locked Loop PLL in the transponder to generate the LO signal. The LO signal is generated by a low loop bandwidth PLL which locks to the original excitation signal's phase but is unable to track the high speed modulated phase shifts. The quadrature data signal is down converted and detected in a mixer or multiplier driven with the LO signal. Depending upon the type of phase detector used in the PLL, and the propagation delays through the circuit, the phase of the LO with respect to the excitation signal can be anywhere between 0° and 360°. If a conventional XOR phase detector is used in the PLL then the output of the PLL oscillator will be at nominally 90 degrees to the excitation signal and will be in phase with the data modulated phase quadrature signal. A 90° phase between the LO and the excitation signal is not necessary for the effective detection of quadrature phase modulation. An XOR mixer has a linear phase to voltage conversion characteristic from 0° to 180° and 180° to 360°. Hence it gives the same output amplitude irrespective of the phase angle except around 0° and 180° where there is a gain sign change.

The average output voltage DC level from a mixer is a function of the average phase difference between its inputs. It is more convenient for circuit operation for the average output to be around midspan and hence an LO with a phase angle of around 90° is more convenient. The phase of the LO signal can be simply adjusted using fixed phase delay elements. Hence a 0° or 180° phase detector can be used and a further 90° (roughly) of phase shift can be achieved with a fixed delay element.

FIG. 4(b) is a phasor diagram of the modulated excitation signal and a quadrature local oscillator signal in the transponder used to demodulate the data signal. The local oscillator signals phase is at 90 degrees with respect to the excitation signal's phase.

For phase modulation the data bandwidth is no broader than the original double sided data bandwidth. When attenuated the level of the modulated data spectrum is extremely low with respect to the excitation signal amplitude making conformance to regulatory emission limits significantly easier than with the prior art.

FIGS. 5(a) to 5(c) are representative frequency spectra that explain the operation of the invention. More particularly, FIG. 5(a) is a typical data spectrum. For data at 100 kbps the first zero of the frequency spectrum occurs at 100 kHz. FIG. 5(b)

is a representative frequency spectrum of the data when modulated onto a quadrature version of the excitation signal. The spectrum for this type of modulation is the same as the double sided spectrum of the original data spectrum. In the invention the modulated quadrature signal is attenuated and added to the original excitation signal. FIG. 5(c) shows the spectrum of the excitation signal Fc plus the attenuated modulated quadrature signal whose spectrum is shown in FIG. 5(b). The attenuation level is given by the difference between the amplitude of the excitation signal and the amplitude of the data sidebands.

Since the spectrum of the transmitted excitation signal is equal to the original double sided data spectrum, narrow band high Q interrogator and transponder antennae are used to respectively transmit and receive the modulated excitation signal. Consequently, the interrogator's excitation antenna operates with high efficiency and the transponder's antenna likewise receives energy with high efficiency. In other embodiments use is made of low Q antennae.

FIGS. 6(a) and 6(b) show methods of modulating and demodulating according to this invention. Turning first to FIG. 6(a), the portion of the main excitation signal is phase shifted 90 degrees to produce a quadrature signal. The quadrature signal is then modulated with data. The preferred form of modulation is phase reverse keying PRK. The PRK modulated quadrature signal is attenuated and then added back to the main excitation signal. Although shown in a particular order the sequence phase shift, modulation and attenuation are done in other orders in alternative embodiments. This method of modulation produces low level data side bands on the excitation signal where the sidebands are in phase quadrature to the excitation signal. The data signal appears as a low amplitude phase jitter on the excitation signal. In some embodiment the signal is further amplitude limited to remove any residual amplitude component.

FIG. 6(b) illustrates a method for demodulating the data modulated on to the excitation signal. A LO signal is generated by a low loop bandwidth phase lock loop PLL. The PLL locks on to the excitation signals phase and is unable to follow the high speed phase jitter caused by the data modulation. For the standard PLL phase detector the PLL oscillator will lock at a fixed phase with respect to the excitation signal's phase. This oscillator signal is then used as a LO to demodulate the quadrature sideband data signal in the multiplier. A low pass filter LPF filters out high frequency mixer products and passes the demodulated data signal.

FIG. 7 shows an example circuit for encoding the data signal for transmission. An excitation reference source Fc is split through a 90 degree splitter. One output from the splitter is fed to the LO port of a mixer. Data is fed to the mixer's IF port and causes PRK modulation of the LO port's signal. The output of the mixer at the RF port is a PRK modulated quadrature signal. This is attenuated and added back onto the reference by a zero degree combiner ready for transmission to the transponder.

FIG. 8 shows an example circuit for decoding the data signal in the transponder. The transponder antenna voltage is squared up by a schmitt trigger, the output of which feeds a type 3 PLL. A type 3 phase detector is a positive edge triggered sequence phase detector which will drive the PLL oscillator to lock at 180° with respect to the input phase. With a low loop bandwidth the PLL is able to easily filter off the sidebands on the input signal. The output of the schmitt is passed through a chain of invertors designed to add a fixed delay to the input signal. The delay is approximately chosen so that the phase of the output from the delay chain is not 0° or 180° with respect to the LO. A preferred phase value is 90° for circuit convenience. The output of the VCO acts as the LO to demodulate the Phase Jitter Modulated data. The data is demodulated in an exclusive OR gate, the output of which is low pass filtered and detected with a floating comparator.

Although the invention has been described with references to a specific example it will be appreciated by those skilled in the art that it may be embodied in many other forms.

What is claimed:

1. A device adapted to receive a modulated signal and derive therefrom a data signal, the device comprising:
   an antenna adapted to receive the modulated signal and, in response thereto, produce a first signal;
   means for deriving, from the first signal, a local oscillator signal;
   means for deriving a second signal by passing a further portion of the first signal through a delay means; and
   wherein the local oscillator signal and the second signal are used to demodulate the first signal and obtain an indicative data signal.

2. The device as claimed in claim 1, wherein a phase locked loop is used to derive the local oscillator signal.

3. The device as claimed in claim 2, wherein the phase locked loop is a low loop bandwidth phase locked loop.

4. The device as claimed in claim 1, wherein a mixer is used in demodulating the first signal.

5. The device as claimed in claim 1, wherein a multiplier is used in demodulating the first signal.

6. The device as claimed in claim 1, wherein the first signal is used as a source of power for the device means.

7. The device as claimed in claim 1, wherein the device is a Radio Frequency Identification Device.

8. The device as claimed in claim 1, wherein the device is a passive device.

9. The device as claimed in claim 1, wherein the device is a transponder.

10. A method of demodulating a modulated signal received by a device and deriving therefrom a data signal, the method comprising the steps of:
    receiving the modulated signal and producing a first signal;
    deriving, from the first signal, a local oscillator signal;
    deriving a second signal by passing a further portion of the first signal through a delay means; and
    demodulating the first signal using the local oscillator signal and the second signal to obtain an indicative data signal.

11. The method as claimed in claim 10, wherein a phase locked loop is used to derive the local oscillator signal.

12. The method as claimed in claim 11, wherein the phase locked loop is a low loop bandwidth phase locked loop.

13. The method as claimed in claim 10, wherein a mixer is used in demodulating the first signal.

14. The method as claimed in claim 10, wherein a multiplier is used in demodulating the first signal.

15. The method as claimed in claim 10, wherein a low pass filter is used to filter out high frequency signal components and pass the demodulated data signal.

16. The method as claimed in claim 10, wherein the first signal is used as a source of power for the device.

17. A method of demodulating a modulated signal received by a device and deriving there from a data signal, the method comprising the steps of:
    receiving the modulated signal and inducing into an antenna of the device, an antenna voltage signal;
    amplifying the antenna signal;
    providing a portion of the amplified signal to a phase locked loop to filter off sidebands and creating a first signal;

passing another portion of the amplified signal through a delay means and creating a second signal; and XORing the first and second signals to provide indicative data.

18. The method as claimed in claim 17, wherein the antenna signal is amplified by squaring the signal by a Schmitt trigger device.

19. The method as claimed in claim 17, wherein the phase locked loop is a low bandwidth phase locked loop device.

20. The method as claimed in claim 17, wherein the data is detected using a floating point comparator device.

* * * * *

UNITED STATES PATENT AND TRADEMARK OFFICE
CERTIFICATE OF CORRECTION

| | | |
|---|---|---|
| PATENT NO. | : 7,978,073 B2 | Page 1 of 1 |
| APPLICATION NO. | : 10/927957 | |
| DATED | : July 12, 2011 | |
| INVENTOR(S) | : Graham Alexander Munro Murdoch et al. | |

It is certified that error appears in the above-identified patent and that said Letters Patent is hereby corrected as shown below:

Title Page
Insert in the Patent Registration Information:

--(30)   Foreign Patent Application Priority Data
         Australia PP 1112 12/24/1997--

Signed and Sealed this
Third Day of January, 2012

David J. Kappos
*Director of the United States Patent and Trademark Office*